United States Patent
Ingram

(10) Patent No.: US 7,319,590 B1
(45) Date of Patent: Jan. 15, 2008

(54) CONDUCTIVE HEAT TRANSFER SYSTEM AND METHOD FOR INTEGRATED CIRCUITS

(75) Inventor: Jason W. Ingram, Allen, TX (US)

(73) Assignee: Raytheon Company, Waltham, MA (US)

( * ) Notice: Subject to any disclaimer, the term of this patent is extended or adjusted under 35 U.S.C. 154(b) by 350 days.

(21) Appl. No.: 10/975,690

(22) Filed: Oct. 27, 2004

(51) Int. Cl.
*H05K 7/20* (2006.01)
*H01L 23/36* (2006.01)

(52) U.S. Cl. .................. 361/704; 361/709; 361/710; 257/713; 257/721

(58) Field of Classification Search .............. 361/688, 361/704, 707, 714, 709, 710; 257/713, 721, 257/E23.102–E23.109
See application file for complete search history.

(56) References Cited

U.S. PATENT DOCUMENTS

| | | | | |
|---|---|---|---|---|
| 4,672,202 A | * | 6/1987 | Crossley et al. | 250/238 |
| 4,869,068 A | * | 9/1989 | Van Vloten | 62/51.1 |
| 4,985,805 A | * | 1/1991 | Riedel et al. | 361/704 |
| 5,077,637 A | * | 12/1991 | Martorana et al. | 361/717 |
| 5,316,080 A | * | 5/1994 | Banks et al. | 165/185 |
| 5,390,734 A | * | 2/1995 | Voorhes et al. | 165/185 |
| 5,510,954 A | * | 4/1996 | Wyler | 361/685 |
| 5,566,752 A | * | 10/1996 | Arnold et al. | 165/185 |
| 5,588,300 A | * | 12/1996 | Larsson et al. | 62/3.61 |
| 5,661,637 A | * | 8/1997 | Villaume | 361/687 |
| 5,825,624 A | * | 10/1998 | Arnold et al. | 361/708 |
| 6,109,369 A | * | 8/2000 | Crumly et al. | 175/52 |
| 6,122,166 A | * | 9/2000 | Mochizuki et al. | 361/687 |
| 6,131,651 A | * | 10/2000 | Richey, III | 165/185 |
| 6,209,200 B1 | * | 4/2001 | Campbell | 29/890.032 |
| 6,324,055 B1 | * | 11/2001 | Kawabe | 361/687 |
| 6,367,509 B1 | * | 4/2002 | Bonneville et al. | 138/96 R |
| 6,407,922 B1 | * | 6/2002 | Eckblad et al. | 361/704 |
| 6,501,647 B1 | * | 12/2002 | Cepeda et al. | 361/687 |
| 6,542,370 B1 | * | 4/2003 | Wang et al. | 361/704 |
| 6,621,698 B2 | * | 9/2003 | Chang | 361/687 |
| 2002/0141155 A1 | * | 10/2002 | Pinneo | 361/688 |
| 2003/0043544 A1 | * | 3/2003 | Nelson et al. | 361/690 |
| 2005/0111189 A1 | * | 5/2005 | Smalc et al. | 361/700 |
| 2005/0168941 A1 | * | 8/2005 | Sokol et al. | 361/688 |

FOREIGN PATENT DOCUMENTS

| | | | | |
|---|---|---|---|---|
| DE | 3820736 A | * | 12/1989 | |
| DE | 4326663 A1 | * | 2/1995 | |
| JP | 59117128 A | * | 7/1984 | |
| JP | 11087959 A | * | 3/1999 | |
| JP | 2000161588 A | * | 6/2000 | |

\* cited by examiner

*Primary Examiner*—Anatoly Vortman
(74) *Attorney, Agent, or Firm*—Baker Botts L.L.P.

(57) ABSTRACT

According to an embodiment of the present invention, a system includes an integrated circuit coupled to a circuit board and a heat conducting element having a thermal conductivity of at least 391 W/m*K. The heat conducting element includes a flexible portion disposed between first and second solid portions, wherein the first solid portion is coupled to the integrated circuit and the second solid portion is coupled to a heat sink.

20 Claims, 1 Drawing Sheet

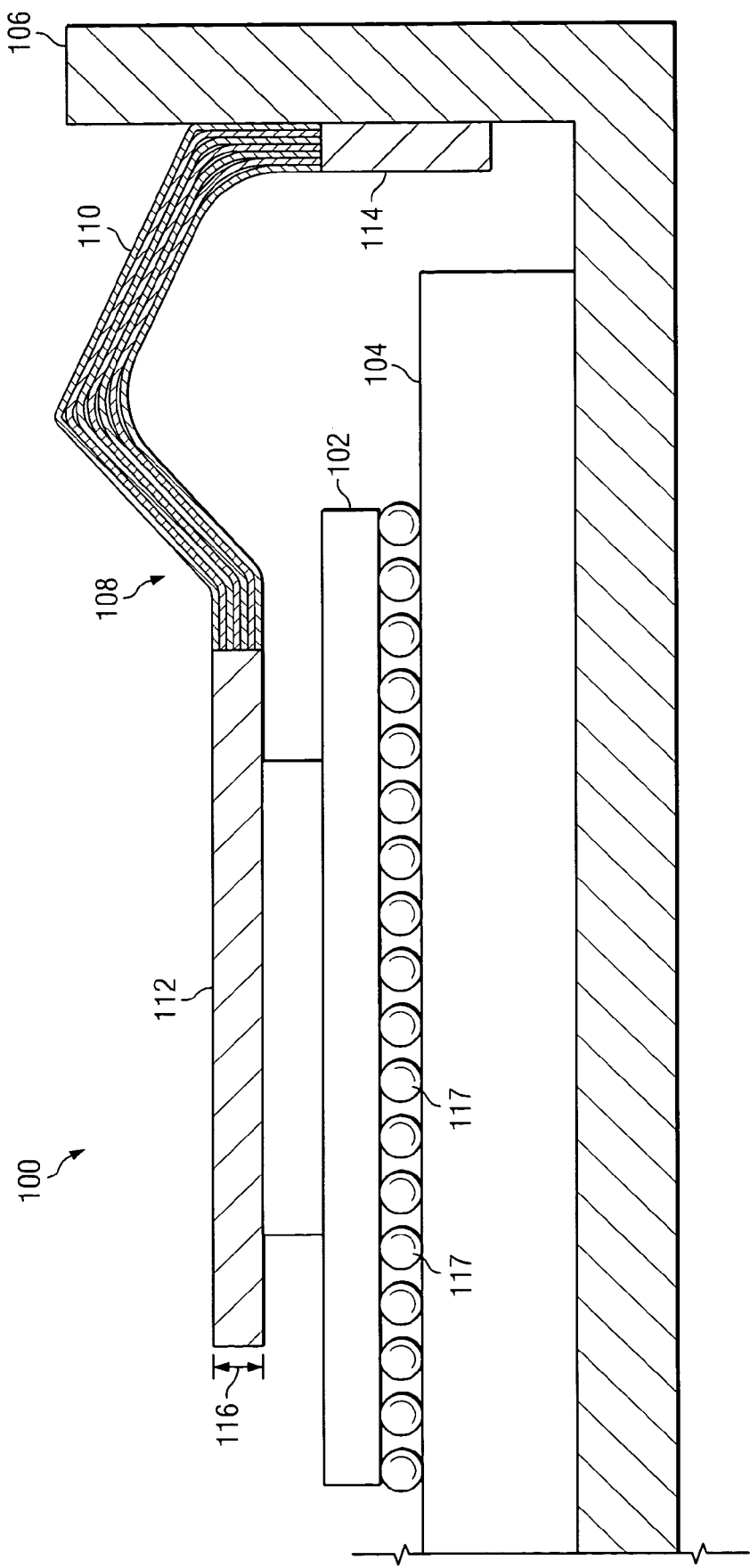

CONDUCTIVE HEAT TRANSFER SYSTEM AND METHOD FOR INTEGRATED CIRCUITS

GOVERNMENT RIGHTS

This invention was made with Government support under Government Contract TX JSF ICP PROJECT, Contract No. N00019-02-C-3002. The government has certain rights in this invention.

TECHNICAL FIELD OF THE INVENTION

This invention relates in general to heat control and, more particularly, to a conductive heat transfer system and method for integrated circuits.

BACKGROUND OF THE INVENTION

Integrated circuit packages sometimes generate enough heat that they must be cooled in order to avoid problems with the packages or surrounding components. Ball grid arrays ("BGAs") are a type of integrated circuit that typically possess high heat density.

One well known cooling technique for integrated circuits is convective cooling. However, convective cooling techniques may not be feasible for all applications. For example, in applications involving high altitude there may not be enough air for effective convective cooling. In this type of situation, conductive cooling becomes an option. Conductive cooling of BGA devices can be a challenge, however, since solder joint durability under the BGA device may be negatively impacted in trying to meet the thermal dissipation challenges.

A solid copper heatstrap is one option for conductive cooling of BGA packages because of its high thermal conductivity. However, depending on the application, its rigidity may cause structural integrity problems with the solder joints under the packages. Other materials that have more flexibility are another option, but these materials may not have the required thermal dissipation needs.

SUMMARY OF THE INVENTION

According to an embodiment of the present invention, a system includes an integrated circuit coupled to a circuit board and a heat conducting element having a thermal conductivity of at least 391 W/m*K. The heat conducting element includes a flexible portion disposed between first and second solid portions, wherein the first solid portion is coupled to the integrated circuit and the second solid portion is coupled to a heat sink.

Embodiments of the invention provide a number of technical advantages. Embodiments of the invention may include all, some, or none of these advantages. For example, a flexible copper heatstrap, according to one embodiment of the invention, facilitates a parallel conduction path for ball grid arrays ("BGAs") to cool the device adequately while minimizing the imposed stress on the BGA and printed wiring board solder connections. This may be important for BGA devices that have a long design life requirement. In one embodiment, such a copper heatstrap has a flexible zone in the middle of two solid sections. The cross-section of the heatstrap stays the same throughout, which allows thermal dissipation needs to be met, while at the same time maintaining long term structural integrity of the BGA device.

Other technical advantages are readily apparent to one skilled in the art from the following FIGURES, descriptions, and claims.

BRIEF DESCRIPTION OF THE DRAWINGS

FIG. 1 is an elevation view of a conductive heat transfer system for an integrated circuit according to one embodiment of the present invention.

DETAILED DESCRIPTION OF THE INVENTION

Embodiments of the present invention and some of their advantages are best understood by referring to FIG. 1, like numerals being used for like and corresponding parts of the various drawings.

FIG. 1 is an elevation view of a conductive heat transfer system 100 for an integrated circuit 102 according to one embodiment of the present invention. Although integrated circuit 102 is illustrated in FIG. 1 as being a ball grid array ("BGA"), the present invention contemplates system 100 being utilized for any suitable integrated circuit. As such, integrated circuit 102 may have any suitable size and shape and any suitable functionality.

In the illustrated embodiment, integrated circuit 102 couples to a circuit board 104, which couples to a housing 106. In addition, integrated circuit 102 is coupled to a heat conducting element 108. According to the teachings of one embodiment of the invention, heat conducting element 108 includes a flexible portion 110 disposed between a first solid portion 112 and a second solid portion 114 and serves as a parallel conduction path for integrated circuit 102.

Circuit board 104 may be any suitable substrate or base that integrated circuit 102 couples to. In one embodiment, circuit board 104 is a printed circuit board that has suitable traces and/or routing therein. Circuit board 104 may be formed from any suitable material and couples to housing 106 in any suitable manner.

Housing 106 may be any suitable housing formed from any suitable material. In one embodiment, housing 106 is formed from a suitable metal. In one embodiment, housing 106 (only a portion of which is shown in FIG. 1) is coupled to a chassis (not explicitly illustrated) that has as coolant flowing therethrough in order to remove heat from housing 106, which, in this embodiment, is used as a heat sink for integrated circuit 102 via heat conducting element 108, as described in further detail below.

Heat conducting element 108, in one embodiment, facilitates a parallel conduction path for integrated circuit 102 in order to adequately cool integrated circuit 102 while minimizing the imposed stress on the connections between integrated circuit 102 and circuit board 104. In this embodiment, the connections are solder connections via a plurality of solder balls 117. In the illustrated embodiment, first solid portion 112 couples to integrated circuit 102 and second solid portion 114 couples to housing 106. Flexible portion 110 is disposed between first solid portion 112 and second solid portion 114 and provides flexibility to heat conducting element 108 in order to ensure structural integrity for integrated circuit 102 by reducing the imposed stress on the connections between integrated circuit 102 and circuit board 104.

In one embodiment of the invention, in order to meet the thermal dissipation requirements for integrated circuit 102, heat conducting element 108 has a thermal conductivity of at least 391 W/m*K. In a more particular embodiment of the invention, this is met by forming heat conducting element 108 from copper. Other suitable materials or combination of materials may also be utilized, such as silver.

Heat conducting element 108 may have any suitable dimensions and any suitable thickness. However, in one embodiment, heat conducting element 108 has a total thickness 116 of between approximately 0.020 inch and approximately 0.250 inch. In a more particular embodiment of the invention, thickness 116 is approximately 0.040 inch. In addition, heat conducting element 108 may be any suitable length and first solid portion 112, flexible portion 110, and second solid portion 114 may also have any suitable length.

Heat conducting element 108 may also be formed in any suitable manner. First solid portion 112, flexible portion 110, and second solid portion 114 may be formed separate from one another and then joined together in any suitable manner or may be formed integral with one another. In the latter embodiment, heat conducting element 108 may be formed from a plurality of sheets of heat conducting material, as illustrated best by flexible portion 110, which shows eight sheets of heat conducting material in a sandwiched configuration. In this embodiment, first solid portion 112 and second solid portion 114 may be formed using a suitable joining process, such as press welding. The present invention, however, contemplates other suitable methods for forming first solid portion 112 and second solid portion 114. Using the press weld technique allows the sheets of heat conducting material to be fused together at their ends, thereby forming first solid portion 112 and second solid portion 114, while still allowing the sheets of material to be separate from one another, thereby forming flexible portion 110.

Each sheet of heat conducting material may have any suitable thickness and there may be any suitable number of heat conducting sheets. In one embodiment, eight sheets of heat conducting material, such as copper, each having a thickness of no more than 0.005 inch are utilized. In an embodiment where first solid portion 112, flexible portion 110, and second solid portion 114 are formed separate from one another and then joined, any suitable method may be utilized to join the ends of flexible portion 112 to each of first solid portion 112 and second solid portion 114, such as welding, brazing, or other suitable techniques.

An important factor in obtaining an adequate amount of thermal dissipation from integrated circuit 102 is that flexible portion 110 have a cross-sectional area approximately equal to at least a cross-sectional area of first solid portion 112. This may be accomplished, as noted above, by forming heat conducting element 108 from a plurality of sheets of heat conducting material.

In operation of one embodiment of the invention, integrated circuit 102 is coupled to circuit board 104, which is coupled to housing 106. First solid portion 112 is then coupled to integrated circuit 102 in any suitable location and second solid portion 114 is coupled to housing 106 in any suitable location. During operation of integrated circuit 102, heat is generated and conducted through heat conducting element 108 to housing 106, which acts as a heat sink. Any coolant that is directed towards the outside of housing 106 may then draw the heat away from housing 106. Thus, heat conducting element 108 facilitates adequate cooling of integrated circuit 102 while minimizing the imposed stress on the connections between integrated circuit 102 and circuit board 104. This is particularly advantageous for integrated circuits that have a long design life requirement.

Although embodiments of the invention and some of their advantages are described in detail, a person skilled in the art could make various alterations, additions, and omissions without departing from the spirit and scope of the present invention as defined by the appended claims.

What is claimed is:

1. A system, comprising:
    an integrated circuit coupled to a circuit board;
    a heat conducting element having a thermal conductivity of at least 391 W/m*K, the heat conducting element comprising a flexible portion disposed between first and second solid portions;
    wherein the heat conducting element comprises a plurality of sheets of heat conducting material stacked in a sandwiched configuration;
    wherein a first end of each of the plurality of sheets of heat conducting material is fused to a first end of another one of the plurality of sheets of heat conducting material to form the first solid portion; and
    wherein a second end of each of the plurality of sheets of heat conducting material is fused to a second end of another one of the plurality of sheets of heat conducting material to form the second solid portion;
    the flexible portion having a cross-sectional area approximately equal to a cross-sectional area of the first solid portion; and
    wherein the first solid portion is coupled to the integrated circuit and the second solid portion is coupled to a heat sink.

2. The system of claim 1, wherein the integrated circuit comprises a ball grid array.

3. The system of claim 1, wherein the heat conducting element is formed from copper.

4. The system of claim 1, wherein the circuit board is coupled to the heat sink.

5. The system of claim 1, wherein the heat conducting material is copper.

6. The system of claim 1, wherein the plurality of sheets of heat conducting material comprise eight sheets of copper each having a thickness of no more than approximately 0.005 inch.

7. The system of claim 1, wherein the heat conducting element comprises a thickness of between approximately 0.020 inch and approximately 0.250 inch.

8. The system of claim 1, wherein the heat conducting element comprises a thickness of approximately 0.040 inch.

9. A method, comprising:
    coupling an integrated circuit to a circuit board;
    providing a heat conducting element having a flexible portion disposed between first and second solid portions, the flexible portion having a cross-sectional area approximately equal to a cross-sectional area of the first solid portion, the heat conducting element formed from a material having a thermal conductivity of at least 391 W/m*K;
    wherein the heat conducting element comprises a plurality of sheets of heat conducting material stacked in a sandwiched configuration;
    wherein a first end of each of the plurality of sheets of heat conducting material is fused to a first end of another one of the plurality of sheets of heat conducting material to form the first solid portion; and
    wherein a second end of each of the plurality of sheets of heat conducting material is fused to a second end of another one of the plurality of sheets of heat conducting material to form the second solid portion;
    coupling the first solid portion of the heat conducting element to the integrated circuit; and
    coupling the second solid portion of the heat conducting element to a heat sink.

10. The method of claim 9, wherein the integrated circuit comprises a ball grid array.

11. The method of claim 9, wherein the heat conducting element is formed from copper.

12. The method of claim 9, further comprising coupling the circuit board to the heat sink.

13. The method of claim 9, wherein the heat conducting material is copper.

14. The method of claim 9, wherein the plurality of sheets of heat conducting material comprise eight sheets of copper each having a thickness of no more than approximately 0.005 inch.

15. The method of claim 9, wherein the heat conducting element comprises a thickness of between approximately 0.020 inch and approximately 0.250 inch.

16. The method of claim 9, wherein the heat conducting element comprises a thickness of approximately 0.040 inch.

17. A system, comprising:
- a ball grid array coupled to a circuit board;
- the circuit board coupled to a housing;
- a heat conducting element formed from a plurality of sheets of copper stacked in a sandwiched configuration, the heat conducting element comprising a flexible portion disposed between first and second solid portions, the flexible portion having a cross-sectional area approximately equal to a cross-sectional area of the first solid portion;
- wherein a first end of each of the plurality of sheets of copper is fused to a first end of another one of the plurality of sheets of copper to form the first solid portion; and
- wherein a second end of each of the plurality of sheets of copper is fused to a second end of another one of the plurality of sheets of copper to form the second solid portion; and
- wherein the first solid portion is coupled to the ball grid array and the second solid portion is coupled to the housing.

18. The system of claim 17, wherein the heat conducting element comprises a thickness of between approximately 0.020 inch and approximately 0.250 inch.

19. The system of claim 17, wherein the heat conducting element comprises a thickness of approximately 0.040 inch.

20. The system of claim 17, wherein the plurality of sheets of copper comprise eight sheets of copper each having a thickness of no more than approximately 0.005 inch.

\* \* \* \* \*